United States Patent [19]

Holz

[11] 4,031,408

[45] June 21, 1977

[54] PROXIMITY SWITCHING SYSTEM

[76] Inventor: George Ernest Holz, 97 Grandview Ave., N. Plainfield, N.J. 07060

[22] Filed: Oct. 3, 1975

[21] Appl. No.: 619,306

[52] U.S. Cl. .............................. 307/116; 340/258 C; 328/5
[51] Int. Cl.² ....................................... H05B 37/00
[58] Field of Search ............... 307/116, 117, 10 LS; 200/DIG. 1, DIG. 2; 317/DIG. 2, 249 PB; 328/5; 340/365 C, 258 C; 315/362

[56] References Cited
UNITED STATES PATENTS

| | | | |
|---|---|---|---|
| 3,666,988 | 5/1972 | Bellis | 307/116 |
| 3,825,797 | 7/1974 | Maeda et al. | 307/10 LS |
| 3,947,696 | 3/1976 | Larson et al. | 328/5 |
| 3,956,743 | 5/1976 | Geiszler | 340/258 C |

*Primary Examiner*—James R. Scott
*Assistant Examiner*—Morris Ginsburg
*Attorney, Agent, or Firm*—Robert A. Green

[57] ABSTRACT

The system utilizes the conventional A. C. power line connected as a signal source and a shield about a sensor electrode mounted in a conventional wall box and coupled to a flip-flop circuit. When a body comes within operating range of the sensor, current flow is generated which operates the flip-flop and turns on an associated lamp. Associated circuitry may also be provided to turn the lamp off automatically and to perform other functions.

16 Claims, 2 Drawing Figures

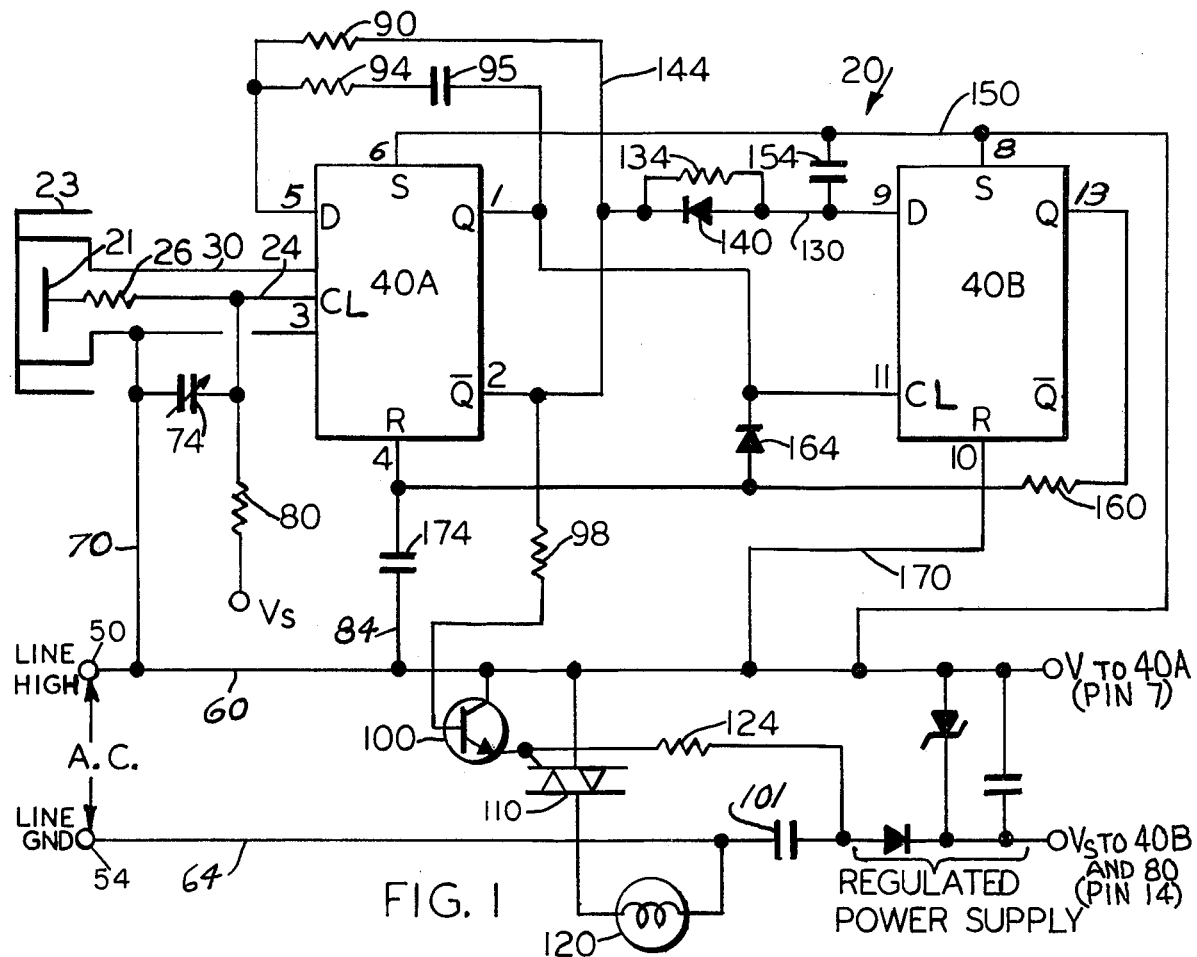
FIG. I
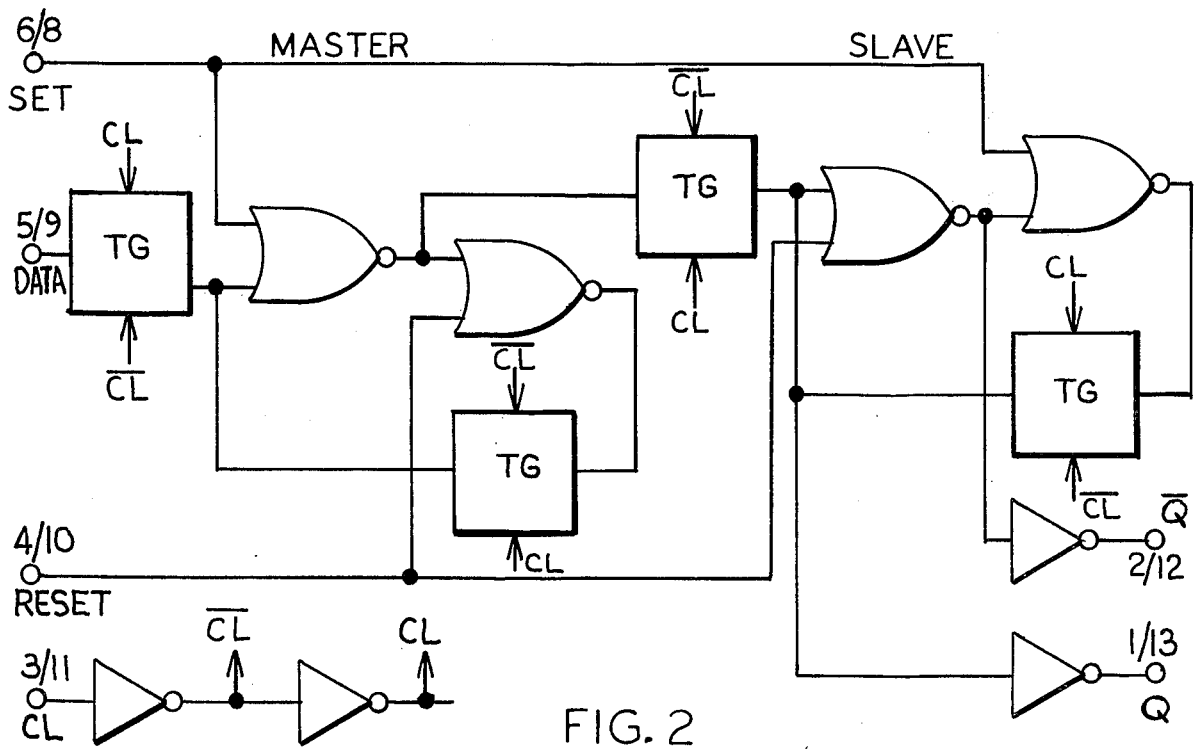
FIG. 2

PROXIMITY SWITCHING SYSTEM

BACKGROUND OF THE INVENTION

Proximity switch arrangements for turning on lights in response to the presence of a human body are known. However, such arrangements have not come into commercial use because they are relatively complex, expensive, utilize excess power, are limited in utility, and are sometimes unsafe. The present invention avoids these problems.

SUMMARY OF THE INVENTION

Briefly, the invention comprises a sensing system which utilizes the conventional A.C. power line as a signal source and as a shield about a sensor electrode, and current for operating a utilization device is generated when a body approaches suitably close to the sensor electrode.

DESCRIPTION OF THE DRAWINGS

FIG. 1 is a schematic circuit representation of the system of the invention; and FIG. 2 is a logic diagram of an integrated circuit module used in the circuit of FIG. 1.

DESCRIPTION OF THE PREFERRED EMBODIMENTS

A system 20 embodying the invention, referring to FIGS. 1 and 2, includes a sensor 21 comprising a generally planar electrode which may be a metal plate or a conductive layer formed on an insulating plate, or the like. The sensor has a lead 24 extending through a large valve resistor 26 to circuit elements to be described. A protective insulating plate 23 is provided in front of the sensor 21 to protect the user from electrical shock.

A conductive shield 30 is disposed about the sensor 21 and its lead 24 to shield the sensor and its lead from spurious signals generated around it. However, the shield is shaped to leave the sensor plate exposed to an individual who might approach the sensor to operate the system as described below. The conventional 110 V, 60 cycle A.C. power line is connected to terminals 50 and 54, with terminal 50 being the high side of the power line and terminal 54 being ground. The high side input terminal is connected to bus 60, and the ground input is connected to bus 64. The high side bus 60 is coupled by lead 70, and an impedance if desired, (not shown), to the sensor shield 30 and through adjustable capacitor 74 to sensor lead 24. Thus, the high side of the power line is, in effect, the shield for the sensor and shields the sensor from spurious signals and especially from ground potential. Capacitor 74 provides a sensitivity adjustment and forms a filter with resistor 26 to filter out spurious line voltage spikes. Sensor lead 24 is also connected through a large resistor 80 (3000 megohms) to a D.C. input reference power supply of about 10 V.

Thus, the sensor 21 is coupled to circuit elements which provide high input impedance and high sensitivity, the circuit including an integrated circuit module 40A which, in one embodiment of the invention, was a 4013D type CMOS flip-flop circuit shown in more detail in FIG. 2. The flip-flop 40A is used to perform a lamp turn-on function. The sensor 21 is connected by its lead 24 to the clock input terminal 3(CL) of module 40A, and the high bus 60 is coupled by lead 84 and capacitor 174 to reset terminal 4(R) of module 40A.

Data input terminal 5(D) is connected through a first resistor 90 to output terminal 2($\overline{Q}$) and through a second path including resistor 94 and capacitor 95 in series to output terminal 1(Q).

The output terminal 2($\overline{Q}$) of module 40A is coupled through resistor 98 to the base or input of transistor 100, the collector of which is connected to bus 60, and the emitter of which is connected to the gate of a triac 110 whose cathode is connected to bus 60 and whose anode is connected to one side of a lamp load 120, the other side of which is connected to bus 64. Current-limiting capacitor 101 is provided in bus 64 between the connection thereto of lamp 120 and the regulated power supply. The lamp 120 is to be turned on, in accordance with the invention.

In operation of this portion of the system of the invention, it is assumed that logic 1 is represented by a high potential and logic 0 by a low potential.

Initially, lamp 120 is off and terminal 1(Q) is low and terminal 2($\overline{Q}$) is high, and current flows from terminal 2($\overline{Q}$) through resistive path 98 to turn on transistor 100. This holds triac 110 off, and, with the triac 110 held off, lamp 120 is also held off. Input terminal 5(D) is also held high by resistor 90. In this phase of the operation of the system, current flows in both directions through resistor 124 connected between the commonly-connected emitter of transistor 100 and the gate of triac 110 and bus 64. This current must be sufficient to drive the gate of the triac. It is desirable that transistor 100 have high forward and high inverse gain in order to shunt this bi-directional current away from the triac when the lamp is off.

The lamp 120 is turned on by an individual coming into proximity with the sensor 21 as follows.

As the user approaches the switch and places his hand suitably close to the input sensor 21 and forces the sensor to receive ground potential, induced currents flow in resistor 80 to provide positive and negative voltage swings at input 3(CL), the clock input terminal of module 40A, as the A.C. power supply goes through its cycle. The circuit is arranged so that the negative excursions serve to switch the flip-flop, and, when a suitably large negative excursion is generated, due to the hand of the user being sufficiently close to the sensor, each negative excursion may change the state of the flip-flop, either to a state in which terminal 1(Q) is high and terminal 2($\overline{Q}$) is low or vice-versa. When 1(Q) is high, transistor 100 turns off, triac 110 turns on, and lamp 120 turns on. Similarly, when terminal 1(Q) is low, transistor 100 turns on, and triac 110 and lamp 120 turn off. If the user's hand is removed when the flip-flop is in such a state that the lamp is on, then the flip-flop will not change state again, and the lamp will remain on. Similarly, if the hand is removed when the lamp is off, then the lamp will remain off.

It is noted that returning capacitor 95 to output 1(Q) supplies positive feedback to keep the alternate states of flip-flop 40A sufficiently long to allow the user sufficient time to control the state. Resistor 94 prevents the input terminal 5(D) from absorbing too large a current spike through capacitor 95 from terminal 1(Q).

In order to provide automatic turn-off for the lamp, the system 20 includes a second 4013 flip-flop module 40B having (1) its input terminal 11(CL) connected to output terminal 1(Q) of module 40A; (2) its input terminal 9(D) connected by lead 130 through parallel-connected resistor 134 and diode 140 to lead 144 which connects resistor 90 to terminal 2(Q), bus 150 connected to terminal 6(S) of module 40A, terminal 8(S) of module 40B and bus 60 of the power supply; (3) capacitor 154 connected between lead 130 at terminal 9(D) and bus 150; (4) output terminal 13(Q) connected through resistor 160 and diode 164 to input terminal 11(CL) and to reset terminal 4(R) of module 40A; and (5) terminal 10(R) connected by lead 170 to bus 60.

In operation of this portion of the system 20, assume that, initially lamp 120 is off, terminal 2($\overline{Q}$) of flip-flop 40A is high, and this state has been maintained long enough to allow capacitor 154 to charge. In this state of the flip-flop, capacitor 154 is charged through resistor 134, and this provides a high logic state at input terminal 9(D) of flip-flop 40B and at capacitor 174 connected in lead 84 between terminal 4(R) and bus 60. As module 40A is switched and lamp 120 is turned on, module 40B is switched by signals coupled from terminal 1(Q) of module 40A to terminal 11(CL) of module 40B and terminal 13(Q) goes to the logic 1 state. In this state, lamp turn-off is automatic but with a relatively long delay determined by the time constant of resistor 160 and capacitor 174.

Diode 164 provides a fast reset to initial conditions and must be a low leakage diode to provide for long delay times. If input signals continue to be applied to terminal 3(CL) of module 40A, capacitor 154 cannot recharge quickly to the logic 1 state through resistor 134 after being held low by diode 140 so that the second time terminal 1(Q) of module 40A goes to logic 1 state and lamp 120 is on, flip-flop 40B is forced to reset, and terminal 13(Q) of module 40B goes low and disables the automatic turnoff feature.

What is claimed is:

1. A control system for operating a utilization device comprising
    an A.C. power line including a high side and a ground side connected to ground,
    a circuit adapted to produce an output signal when it receives an input signal and having input terminal means and output terminal means,
    said utilization device being coupled to the output terminal means of said circuit, and
    capacitive input signal means coupled by a lead to said input terminal means and comprising a sensor electrode and a conductive shield surrounding said sensor electrode and said lead to shield said sensor from spurious signals, the high side of said A.C. power line being connected to said shield, said sensor electrode being accessible for capacitive coupling to a human body positioned adjacent thereto for generating input signals for said circuit.
2. The system of claim 1 wherein said circuit comprises a flip-flop module.
3. The system of claim 1 wherein said output terminal means is coupled through semiconductor control means to said utilization device.
4. The system of claim 1 wherein said output terminal means includes a terminal connected through a transistor and a triac to said utilization device, said triac and said utilization device being off when said transistor is caused to be on by the potential at said terminal.
5. A control system for operating a utilization device comprising
    an A.C. power line including a high side and a ground side connected to ground,
    a first circuit adapted to produce an output signal when it receives an input signal and having input terminal means and output terminal means,
    said utilization device being coupled to the output terminal means of said first circuit,
    capacitive input signal means coupled by a lead to said input terminal means and comprising a conductive sensor and a conductive shield surrounding said sensor and said lead to shield said sensor from spurious signals, the high side of the said A.C. power line being connected to said shield, said sensor being accessible for capacitive coupling to a human body positioned adjacent thereto for generating input signals for said circuit, and
    means including a second circuit coupled between said first circuit and said utilization device for controlling the time of operation of said utilization device after its state has been set by said first circuit.
6. The system defined in claim 5 wherein the last mentioned means includes
    a charge-storing circuit coupled between said second circuit and said utilization device for controlling the time of operation of said utilization device.
7. The system defined in claim 6 wherein said charge-storing circuit comprises a resistor-capacitor circuit.
8. The system of claim 5 wherein said first and second circuits comprise flip-flop modules.
9. The system of claim 5 wherein said output terminal means of said first circuit is coupled through semiconductor control means to said utilization device.
10. The system of claim 5 wherein said output terminal means of said first circuit includes a terminal connected through a transistor and a triac to said utilization device, said triac and said utilization device being off when said transistor is caused to be on by the potential at said terminal.
11. The system defined in claim 10 and including
    a charge-storing circuit coupled between said second circuit and said utilization device.
12. The system defined in claim 11 wherein said charge-storing circuit comprises a capacitor coupled between said first circuit and one electrode of said transistor, and a resistor coupled between said first circuit and another electrode of said transistor, said capacitor also being coupled to an output terminal of said second circuit, said output terminal of said second circuit, when in one logic state, carrying potential which serves to turn off said utilization device after a time determined by the time constant of said capacitor and resistor.
13. The apparatus defined in claim 1 wherein the connection of said shield to said power line shields said sensor electrode from ground potential.
14. The apparatus defined in claim 5 wherein the connection of said shield to said power line shields said sensor from ground potential.
15. The apparatus defined in claim 1 and including a resistor in series with said lead to said sensor electrode, and a capacitor connected between said high side of said A.C. power line and said lead, said resistor and capacitor comprising a filter for filtering out noise signals.
16. The apparatus defined in claim 5 and including a resistor in series with said lead to said sensor, and a capacitor connected between said high side of said A.C. power line and said lead, said resistor and capacitor comprising a filter for filtering out noise signals.

* * * * *